United States Patent
Ko et al.

(10) Patent No.: US 9,293,736 B2
(45) Date of Patent: Mar. 22, 2016

(54) ORGANIC LIGHT EMITTING ELEMENT HAVING EMISSION LAYERS AND AN ELECTRON INJECTION LAYER INCLUDING FULLERENE AND LITHIUM QUINOLATE

(75) Inventors: Hee-Joo Ko, Yongin (KR); Se-Jin Cho, Yongin (KR); Bo-Ra Lee, Yongin (KR); Chang-Ho Lee, Yongin (KR); Il-Soo Oh, Yongin (KR); Hyung-Jun Song, Yongin (KR); Jin-Young Yun, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 1019 days.

(21) Appl. No.: 13/292,912

(22) Filed: Nov. 9, 2011

(65) Prior Publication Data

US 2012/0326132 A1 Dec. 27, 2012

(30) Foreign Application Priority Data

Jun. 27, 2011 (KR) .................. 10-2011-0062462

(51) Int. Cl.
*H01L 29/08* (2006.01)
*H01L 35/24* (2006.01)
*H01L 51/00* (2006.01)
*H01L 51/52* (2006.01)
*B82Y 20/00* (2011.01)

(52) U.S. Cl.
CPC ............. *H01L 51/5278* (2013.01); *B82Y 20/00* (2013.01)

(58) Field of Classification Search
CPC ........................... H01L 51/5278; B82Y 20/00
USPC ............................................................. 257/40
See application file for complete search history.

(56) References Cited

U.S. PATENT DOCUMENTS

| 7,859,186 B2 * | 12/2010 | Noh et al. ...................... 313/504 |
| 8,603,642 B2 * | 12/2013 | Hatwar et al. ................ 428/617 |
| 2007/0046189 A1 * | 3/2007 | Hatwar et al. ................ 313/506 |
| 2009/0195146 A1 | 8/2009 | Hatwar et al. |
| 2011/0240964 A1 * | 10/2011 | Ko et al. ......................... 257/40 |

FOREIGN PATENT DOCUMENTS

| KR | 10-2006-0012120 A | 2/2006 |
| KR | 10-2007-0043014 A | 4/2007 |
| KR | 10-2010-0068617 A | 6/2010 |

* cited by examiner

*Primary Examiner* — Stephen W Smoot
*Assistant Examiner* — Vicki B Booker
(74) *Attorney, Agent, or Firm* — Lewis Roca Rothgerber Christie LLP

(57) ABSTRACT

An organic light emitting element includes a first electrode, a second electrode, and an organic layer. The organic layer includes a first emission layer between the first electrode and the second electrode, a second emission layer between the first emission layer and the second electrode, and an electron injection layer (EIL) between the first emission layer and the second emission layer, the electron injection layer (EIL) containing fullerene (C60).

9 Claims, 3 Drawing Sheets

ORGANIC LIGHT EMITTING ELEMENT HAVING EMISSION LAYERS AND AN ELECTRON INJECTION LAYER INCLUDING FULLERENE AND LITHIUM QUINOLATE

CROSS-REFERENCE TO RELATED APPLICATION

This application claims priority to and the benefit of Korean Patent Application No. 10-2011-0062462 filed in the Korean Intellectual Property Office on Jun. 27, 2011, the entire content of which is incorporated herein by reference.

BACKGROUND

1. Field

Aspects of embodiments according to the present invention relate to an organic light emitting element.

2. Description of Related Art

An organic light emitting diode (OLED) display device includes a plurality of organic light emitting elements, and an organic light emitting element includes an anode, a cathode, and an organic light emitting member between the anode and the cathode.

The organic light emitting element utilizes a principle that excitons are generated by the binding (or recombination) of electrons and holes in an organic emission layer between the two electrodes when electrons and holes are injected into the organic emission layer from the two electrodes. Thus, light is generated when the excitons fall from an excited state to a ground state.

Here, the organic light emitting diode (OLED) display device including the organic light emitting element is of a self-light emitting type, and it does not use a light source. Thus, it is not only advantageous in terms of power consumption, but also has excellent response speed, viewing angle, and contrast ratio.

The organic light emitting member emits light of white color or primary colors, and it includes an emission layer and additional layers, which include an electron injection layer (EIL), a hole injection layer (HIL), an electron transport layer (ETL), and a hole transport layer (HTL).

In the case of the white color organic light emitting member, the emission layer generally has a structure where light emitting materials emitting lights of the three primary colors, which include red, green, and blue, are stacked. As the stacked red, green, and blue emission layers emit the lights concurrently (e.g., simultaneously), white light that is balanced overall may be obtained.

SUMMARY

An exemplary embodiment of the present invention provides an organic light emitting element that has a tandem structure and has a low driving voltage. Another embodiment of the present invention provides an organic light emitting element with improved life-span characteristic. An organic light emitting element includes a first electrode, a second electrode, and an organic layer therebetween. The organic layer includes a first emission layer between the first electrode and the second electrode, a second emission layer between the first emission layer and the second electrode, and an electron injection layer (EIL) between the first emission layer and the second emission layer, and including fullerene ($C_{60}$).

The organic light emitting element may have a tandem structure including a first unit device and a second unit device stacked on the first unit device, the first unit device including the first electrode, the first emission layer, and the electron injection layer (EIL), and the second unit device including the second emission layer and the second electrode. A charge generation layer may not be included.

The electron injection layer (EIL) may include a lithium quinolate (LiQ)-containing first electron injection layer (EIL) and a fullerene ($C_{60}$)-containing second electron injection layer (EIL).

The organic light emitting element may further include an electron transport layer (ETL) between the first emission layer and the electron injection layer (EIL).

The first emission layer may be a red or green emission layer, and the second emission layer may be a blue emission layer.

The organic layer may have a thickness between 160 nm and 300 nm.

The first electrode may be an anode, and the second electrode may be a cathode.

The organic light emitting element may have a tandem structure including a first unit device and a second unit device stacked on the first unit device, the first unit device including the first electrode, the first emission layer, and the electron injection layer (EIL), the second unit device including the second emission layer and the second electrode. The first unit device or the second unit device may include a hole transport layer (HTL) doped with a P-type material.

The organic layer may further include at least one layer selected from the group consisting of a hole injection layer (HIL), a hole transport layer (HTL), an electron blocking layer, an emission layer, a hole blocking layer, an electron transport layer (ETL), and an electron injection layer (EIL).

The organic light emitting element may have excellent life-span characteristics.

DETAILED DESCRIPTION OF THE EMBODIMENTS

Figure 1:
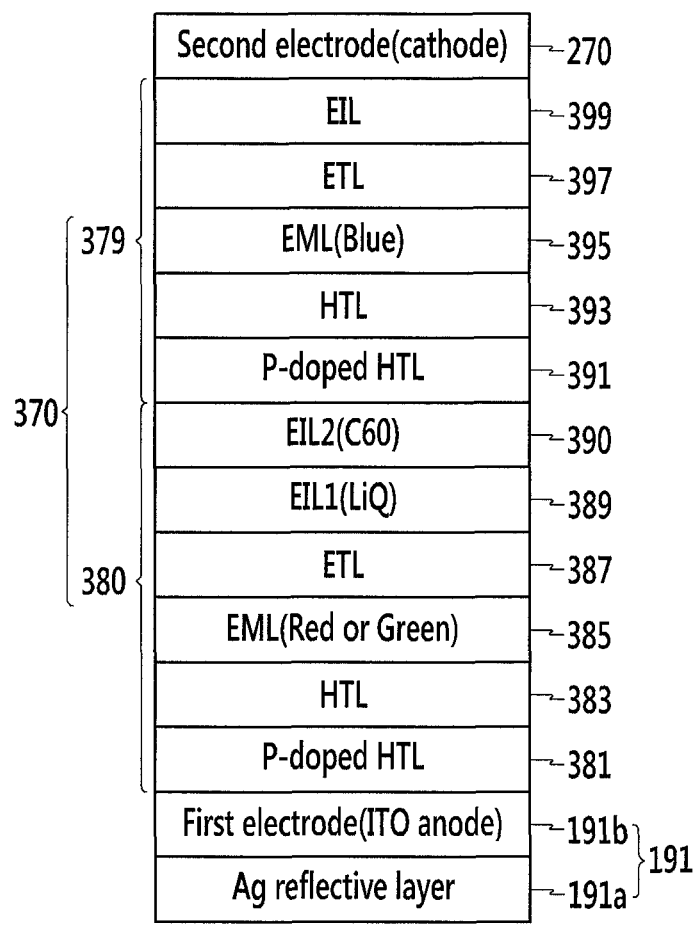
FIG. 1 is a schematic view showing an organic light emitting element according to an embodiment of the present invention.

This disclosure will be described more fully hereinafter with reference to the accompanying drawings, in which exemplary embodiments of the invention are shown. This disclosure may, however, be embodied in many different forms and is not construed as limited to the exemplary embodiments set forth herein. Rather, the exemplary embodiments disclosed herein are provided to completely and thoroughly describe the technology of the present invention and to make a person of an ordinary skill in the art understand the concept and scope of the present invention.

In the drawings, the thickness of layers, films, panels, regions, etc., may be exaggerated for clarity. It will be understood that when an element such as a layer, or a substrate is referred to as being "on" another element, it can be directly on the other element, or intervening elements may also be present. The same reference numerals are given to the same constituent elements throughout the specification.

FIG. 1 is a schematic view showing an organic light emitting element according to an embodiment of the present invention.

Referring to FIG. 1, an organic light emitting member 370 includes a lower light emitting member 380 and an upper light emitting member 379.

The organic light emitting member 370 including the lower and upper light emitting members 380 and 379 includes a first electrode 191, a first emission layer 385, a fullerene (C60)-containing electron injection layer (EIL2) 390, a second emission layer 395, and a second electrode 270. Selectively, it may further include a lithium quinolate (LiQ)-containing first electron injection layer (EIL1) 389 and the fullerene (C60)-containing second electron injection layer (EIL2) 390 by including a lithium quinolate (LiQ)-containing electron injection layer (EIL1) between the first emission layer 385 and the fullerene (C60)-containing second electron injection layer (EIL2) 390.

The organic light emitting member 370 has a tandem structure of two unit devices, which include the lower light emitting member 380 and the upper light emitting member 379 that emit lights of different colors.

The tandem structure, where the two unit devices emitting lights of two different colors are stacked, may further include a charge generation layer between the two unit devices. The charge generation layer is formed of a material having a considerably low Lowest Unoccupied Molecular Orbital (LUMO) that is similar to the Highest Occupied Molecular Orbital (HOMO) of a hole injection layer (HIL) that may be included in a unit device of the upper light emitting member. Therefore, electrons easily transfer from the hole injection layer (HIL) that may be included in the unit device of the upper light emitting member to the charge generation layer, thereby forming holes in the hole injection layer (HIL) that may be included in the unit device of the upper light emitting member.

The organic light emitting element of the tandem structure has an improved efficiency because the combined luminance emitted from each of the stacked unit devices is more than that of an organic light emitting element that is formed of one unit device when a current of same magnitude is applied. However, since the thickness of the overall device becomes thicker in proportion to the number of stacked unit devices, which is one of the characteristics of a simple stacked structure, the driving voltage is increased.

As described above, the tandem structure tends to increase driving voltage in proportion to the number of layers of the stacked unit devices. As described above, the flow of electrons from the unit devices of the upper light emitting member to the unit devices of the lower light emitting member may be made smooth by positioning the charge generation layer between the unit devices.

The organic light emitting member 370 may not include the charge generation layer, which is described above. The fullerene (C60)-containing second electron injection layer (EIL2) 390 is introduced into the lower light emitting member 380, and the dipole characteristics of the fullerene may have electrons transfer from the unit devices of the upper light emitting member to the lower light emitting member 380. For example, due to the dipole characteristics of the fullerene (C60)-containing second electron injection layer (EIL2) 390, electrons may easily transfer from the unit devices of the upper light emitting member 379 to the LUMO of the electron transport layer (ETL) included in the unit devices of the lower light emitting member 380 along a stacking structure. Based on this principle, the organic light emitting member 370 has a tandem structure and has a decreased driving voltage while not including the charge generation layer. As a result, the life-span characteristic of the organic light emitting element may be improved.

It is generally known that the life-span characteristics of fullerene (C60) deteriorates when it is applied to an organic light emitting element, whereas an organic light emitting element including the organic light emitting member 370 according to an embodiment of the present invention has improved life-span characteristics.

The organic light emitting member 370 may or may not include an electron transport layer (ETL) 387 between the first emission layer 385 and the fullerene (C60)-containing second electron injection layer (EIL2) 390.

The electron injection layer (EIL) of the lower light emitting member 380 may include a single layer of the fullerene (C60)-containing second electron injection layer (EIL2) 390 or may include two layers of the lithium quinolate (LiQ)-containing first electron injection layer (EIL1) 389 and the fullerene (C60)-containing second electron injection layer (EIL2) 390. The lithium quinolate (LiQ)-containing first electron injection layer (EIL1) 389 facilitates the transfer of electrons based on the dipole characteristics of the fullerene (C60)-containing second electron injection layer (EIL2) 390. When the lower light emitting member 380 includes two layers of electron injection layers (EIL), the electron transport layer (ETL) 387 may or may not be formed between the first emission layer 385 and the lithium quinolate (LiQ)-containing first electron injection layer (EIL1) 389.

The electron injection layer (EIL) formed in the lower light emitting member 380 of the organic light emitting member 370 includes a material having dipole characteristics and takes an advantage of the dipole characteristics. Since the EIL does not use a material having a low LUMO, it is differentiated from the charge generation layer that includes a material having low LUMO to solve the problem of increasing driving voltage in a tandem structure.

The first emission layer 385 is formed of a red or green emission layer, and the second emission layer 395 is formed of a blue emission layer.

In FIG. 1, an organic light emitting element including the first electrode 191, the second electrode 270 facing the first electrode 191, and an organic light emitting member 370, is illustrated. The first electrode 191 includes a reflective layer 191a and a transparent conductive layer 191b.

One of the first electrode 191 and the second electrode 270 may be an anode, and the other is a cathode. The first electrode 191 and the second electrode 270 may be transparent or opaque electrodes. For example, the first electrode 191 and the second electrode 270 may include ITO, IZO, or a combination thereof, or the first electrode 191 and the second electrode 270 may include aluminum (Al), silver (Ag), or a combination thereof. For example, the first electrode 191 may be an anode, and the second electrode 270 is a cathode.

In FIG. 1, the first electrode 191 may be formed in a multi-layer structure including the reflective layer 191a and the transparent conductive layer 191b to form a resonance structure of the organic light emitting element, and the second electrode 270 may be formed including a single layer or multiple layers of a semi-permeable conductive material which includes at least one of aluminum (Al), silver (Ag), calcium (Ca), CaAg, MgAg, AlAg, or a combination thereof.

The reflective layer 191a may be formed of an opaque metal such as aluminum (Al), copper (Cu), molybdenum (Mo), silver (Ag), or a combination thereof, and the transparent conductive layer 191b may be formed of a material such as indium tin oxide or indium zinc oxide.

The reflective layer 191a may cause a microcavity effect along with the second electrode 270. The microcavity effect amplifies the light of a particular wavelength by iteratively reflecting light with the reflective layer and a transparent layer (or a translucent layer).

The first electrode 191 including the reflective layer 191a forms a cavity that greatly reforms the light emitting characteristics of the light emitted from the emission layer. The light emission in a wavelength corresponding to the resonance wavelength is enhanced through the second electrode 270, and the light emission of the other wavelengths is suppressed. Herein, the enhancement or suppression of the light of the particular wavelength may be decided based on the distance between the first electrode 191 and the second electrode 270. The distance between the first electrode 191 and the second electrode 270 may be controlled by adjusting the thickness of an organic layer, for example, the organic light emitting member 370, and the light of the particular wavelength may be enhanced or suppressed by the control of the distance. However, the present invention is not limited thereto, and the distance between the first electrode 191 and the second electrode 270 may be controlled through other suitable methods.

A capping layer (not shown) may be further formed above the second electrode 270. The capping layer is an auxiliary layer that may be formed above a cathode to raise the light emission efficiency by resonance in a top-emission light emitting element.

For example, a blue resonance structure may be formed by forming the organic light emitting member 370 with a thickness of 160 nm to 200 nm. In this case, the red light emission of the lower light emitting member 380 is optically filtered to realize a blue light.

The above-described organic light emitting element does not use a fine metal mask (FMM) process. An organic light emitting element which does not have a tandem structure further includes an R light emitting auxiliary layer and a G light emitting auxiliary layer to correct the resonance thickness to perform the FMM process for the patterning of red (R), green (G) and blue (B). On the other hand, the organic light emitting element according to the embodiment of the present invention is made with reduced number of masking processes by stacking two emission layers. (Herein, each color is realized through the adjustment of resonance thickness). Furthermore, for example, the masking processes for forming a G light emitting auxiliary layer may be reduced or removed by adopting a green color change matrix (CCM) into a structure where an R emission layer and a B emission layer are stacked.

An organic layer of the organic light emitting element, which is a first unit device of the lower light emitting member 380 and a second unit device of the upper light emitting member 379, may be formed in diverse structures by including at least one selected from the group consisting of a hole injection layer (HIL), a hole transport layer (HTL), an electron blocking layer, an emission layer, a hole blocking layer, an electron transport layer (ETL), and an electron injection layer (EIL). The organic layer of the organic light emitting element may further include an intermediate layer of one layer or two layers.

In FIG. 1, the lower light emitting member 380 further includes a P-type material-doped hole transport layer (HTL) 381, a hole transport layer (HTL) 383, and the electron transport layer (ETL) 387 to facilitate the supply of holes; and the upper light emitting member 379 further includes a P-type material-doped hole transport layer (HTL) 391, a hole transport layer (HTL) 393, an electron transport layer (ETL) 397, and an electron injection layer (EIL) 399.

Figure 2:
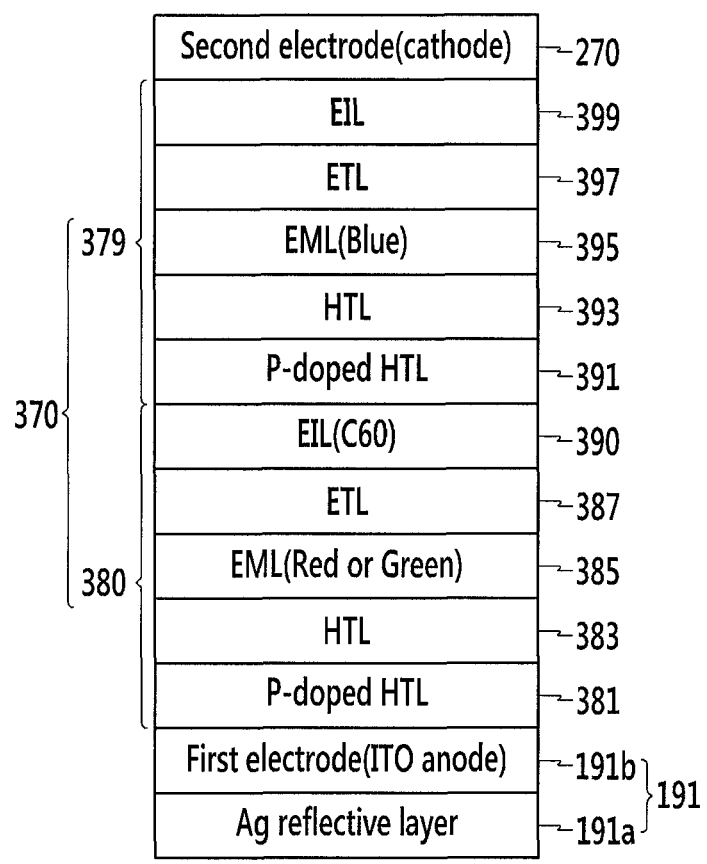
FIG. 2 is a schematic view showing an organic light emitting element according to another embodiment of the present invention.

FIG. 2 exemplarily illustrates an organic light emitting element where an electron injection layer (EIL) of the lower light emitting member 380 is formed in a single-layer structure of a fullerene (C60)-containing electron injection layer (EIL).

While the present invention has been described above with respect to the exemplary embodiments, the scope and spirit of the invention are not limited to the embodiments, and it will be apparent to those skilled in the art that various changes and modifications may be made without departing from the scope and spirit of the present invention as defined in the below claims and their equivalents.

The following examples illustrate embodiments of the present invention in more detail. These examples, however, are not in any sense to be interpreted as limiting the scope of the present invention.

Example 1

An organic layer was formed by sequentially forming an Ag reflective layer and an ITO electrode on a glass substrate and stacking a second unit device having a structure of a first hole transport layer (HTL) at 100 Å doped with a P-type material, a second hole transport layer (HTL) at 200 Å, a blue emission layer 200 Å, an electron transport layer (ETL) at 300 Å, and an electron injection layer (EIL) at 20 Å, on a first unit device having an electron injection layer (EIL) structure including a first hole transport layer (HTL) at 100 Å doped with a P-type material, a hole transport layer (HTL) at 550 Å, a red emission layer at 200 Å, an electron transfer layer at 100 Å, and a fullerene (C60) layer at 15 Å. An organic light emitting element shown in FIG. 1 was fabricated by forming an electrode made of LiF at 10 Å and MgAg (10:1) at 200 Å, on the organic layer. The total thickness of the organic layer was 178.5 nm.

Comparative Example 1

An organic layer was formed by stacking a second unit device having a structure of a first hole transport layer (HTL) at 100 Å doped with a P-type material, a second hole transport layer (HTL) at 200 Å, a blue emission layer at 200 Å, an electron transport layer (ETL) at 300 Å, and an electron injection layer (EIL) at 20 Å, on a first unit device having a charge generation layer (CGL) structure including a first hole transport layer (HTL) at 100 Å doped with a P-type material, a hole transport layer (HTL) at 550 Å, a red emission layer at 200 Å, an electron transfer layer at 100 Å, and a $WO_3$ layer at 50 Å. An organic light emitting element was fabricated by forming an electrode made of LiF at 10 Å and MgAg (10:1) at 200 Å, on the organic layer. The total thickness of the organic layer was 182 nm.

Experimental Example 1

The current-voltage-luminance (IVL) characteristics of the organic light emitting elements fabricated according to Example 1 and Comparative Example 1 were measured and the life-span characteristics of the organic light emitting elements fabricated according to Example 1 and Comparative Example 1 were evaluated. The currents and luminances of the organic light emitting elements fabricated according to Example 1 and Comparative Example 1 at each voltage level were measured by using a power supplier KEITHLEY® 238 CURRENT SOURCE MEASURE UNIT and a luminance measuring instrument PHOTO RESEARCH® PR650 and performing a scanning process with a voltage between −6V and 6V. (KEITHLEY® is a registered U.S. trademark owned by Keithley Instructments, Inc. PHOTO RESEARCH® is a registered U.S. trademark owned by Kollmorgen Corporation.) After the measurement, life-spans were measured until the moment when the luminance is decreased down to 80% of the initial luminance by applying a current corresponding to a requested luminance required for a blue color based on the standard of white 400 nit.

IVL characteristic results were presented in the following Table 1.

TABLE 1

| | Driving voltage (V) | Current density (mA/cm$^2$) | Luminous efficiency (Cd/A) | Luminous efficiency (lm/W) | Luminance (Cd/m$^2$) | Color coordinate | |
|---|---|---|---|---|---|---|---|
| | | | | | | CIEx | CIEy |
| Example 1 | 10 | 9.484 | 4.5363313 | 1.1236063 | 339.2 | 0.1449 | 0.0511 |
| | 12 | 49.1275 | 4.2630903 | 0.886742 | 1664 | 0.1449 | 0.0511 |
| Comparative Example 1 | 10.5 | 10.392125 | 4.5380516 | 1.3577819 | 471.6 | 0.1405 | 0.0508 |
| | 13 | 43.66875 | 4.312008 | 1.0420441 | 1883 | 0.1405 | 0.0507 |

Figure 3:
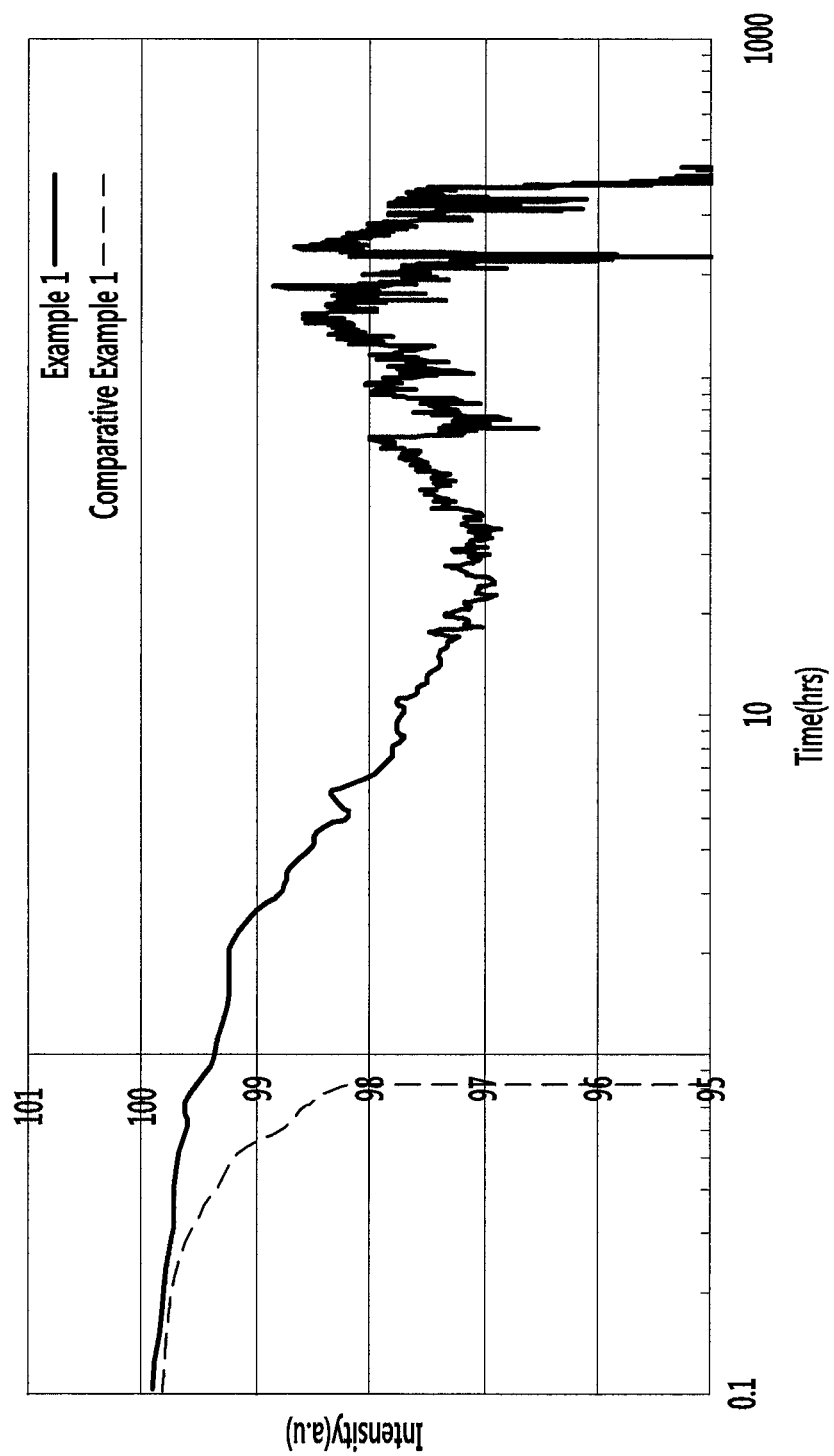
FIG. 3 shows life-span characteristics and luminance intensity vs. time of organic light emitting element, according to Examples.

FIG. 3 is a graph showing the luminance intensities of the organic light emitting elements fabricated according to Example 1 and Comparative Example 1 with respect to time. The graph shows that the life-span of the organic light emitting element fabricated according to Example 1 is superior to that of the organic light emitting element fabricated according to Comparative Example 1.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and their equivalents.

DESCRIPTION OF SOME OF THE REFERENCE NUMERALS

191: first electrode
381: P-type material-doped hole transport layer (HTL)
383: hole transport layer (HTL)
385: first emission layer (EML)
387: electron transport layer (ETL)
389: LiQ-containing electron injection layer (EIL)
390: fullerene (C60)-containing electron injection layer (EIL)
391: P-type material-doped hole transport layer (HTL)
393: hole transport layer (HTL)
395: second emission layer EML
397: electron transport layer (ETL)
399: electron injection layer (EIL)
280: second electrode

What is claimed is:

1. An organic light emitting element comprising:
    a first electrode, a second electrode, and an organic layer therebetween,
    wherein the organic layer comprises:
        a first emission layer between the first electrode and the second electrode;
        a second emission layer between the first emission layer and the second electrode; and
        an electron injection layer (EIL) between the first emission layer and the second emission layer, and comprising fullerene (C60) and lithium quinolate (LiQ).

2. The organic light emitting element of claim 1,
    wherein the organic light emitting element has a tandem structure comprising a first unit device and a second unit device stacked on the first unit device, the first unit device comprising the first electrode, the first emission layer, and the electron injection layer (EIL), and the second unit device comprising the second emission layer and the second electrode, and
    wherein a charge generation layer is not included.

3. The organic light emitting element of claim 1, wherein the electron injection layer (EIL) comprises a lithium quinolate (LiQ)-containing first electron injection layer (EIL) and a fullerene (C60)-containing second electron injection layer (EIL).

4. The organic light emitting element of claim 1, further comprising an electron transport layer (ETL) between the first emission layer and the electron injection layer (EIL).

5. The organic light emitting element of claim 1, wherein the first emission layer is a red or green emission layer, and the second emission layer is a blue emission layer.

6. The organic light emitting element of claim 1, wherein the organic layer has a thickness between 160 nm and 300 nm.

7. The organic light emitting element of claim 1, wherein the first electrode is an anode, and the second electrode is a cathode.

8. The organic light emitting element of claim 1,
    wherein the organic light emitting element has a tandem structure comprising a first unit device, and a second unit device stacked on the first unit device, the first unit device comprising the first electrode, the first emission layer, and the electron injection layer (EIL), the second unit device comprising the second emission layer and the second electrode, and
    wherein the first unit device or the second unit device comprises a hole transport layer (HTL) doped with a P-type material.

9. The organic light emitting element of claim 1, wherein the organic layer further comprises at least one layer selected from the group consisting of a hole injection layer (HIL), a hole transport layer (HTL), an electron blocking layer, an emission layer, a hole blocking layer, an electron transport layer (ETL), and an electron injection layer (EIL).

* * * * *